United States Patent [19]

Brun et al.

[11] 4,267,529
[45] May 12, 1981

[54] TV ANTENNA ISOLATION SYSTEM

[75] Inventors: Craig W. Brun, Honeoye Falls; Wilfred L. Hand, Clarence, both of N.Y.

[73] Assignee: GTE Products Corporation, Stamford, Conn.

[21] Appl. No.: 120,182

[22] Filed: Feb. 11, 1980

[51] Int. Cl.³ .............................................. H01P 5/00
[52] U.S. Cl. ...................................... 333/12; 333/185; 333/245
[58] Field of Search ................... 333/12, 185, 243, 245, 333/181, 182; 343/787, 851, 885

[56] References Cited

U.S. PATENT DOCUMENTS

| 2,865,006 | 12/1958 | Sabaroff | 333/12 X |
| 3,638,147 | 1/1972 | Denes | 333/185 X |
| 3,879,691 | 4/1975 | Fritz | 333/185 X |
| 4,122,416 | 10/1978 | Oblak et al. | 333/12 X |

Primary Examiner—Paul L. Gensler
Attorney, Agent, or Firm—John A. Odozynski

[57] ABSTRACT

An apparatus for coupling a source of signals to a receiver having a ground return electrically coupled to the AC line and for providing immunity from interfering ambient signals. The apparatus includes a coaxial transmission line surrounded at both ends by feedthrough capacitor coupling the outer conductor of the transmission line to the ground return of the signal source. A toroidal ferrite member also surrounds the transmission line between the feedthrough capacitors thereby reducing the current flowing in the outer conductor and the resulting direct pickup of ambient signals.

11 Claims, 1 Drawing Figure

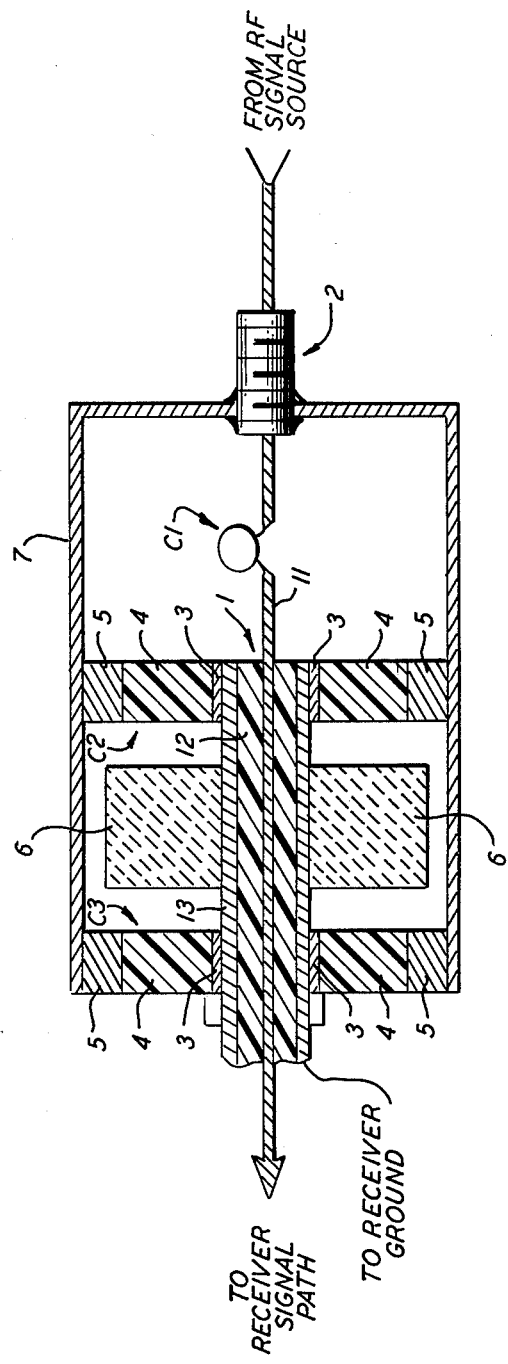

TV ANTENNA ISOLATION SYSTEM

TECHNICAL FIELD

This invention relates to antenna isolation systems and more particularly to a system that minimizes the direct pickup problem associated, for example, with television receivers having a ground return connected to the AC power line.

BACKGROUND ART

Television receivers that include an AC power line input transformer are generally desireable because, inter alia, they provide a substantial degree of isolation between the AC line return and the television receiver ground. However, because of their size, weight and cost, power line transformers are often necessarily omitted in the design of certain types of television receivers; for example, portable models such as those usually found in hotels and motels will often be of the "hot chassis" variety, that is, the receiver ground will be connected to the AC line return.

It has been found that one of the performance problems posed by hot chassis receivers, especially when used in conjunction with MATV or CATV systems, is that of direct pickup. That is, if the receiver is operating in an area where there is relatively strong ambient field, such as may be generated by a nearby TV transmitter, then the outer shield of the coaxial cable carrying the MATV or CATV signal will pick up a voltage as a result of that field. Unless precautions are taken, this voltage will be coupled to the input of the TV receiver. Specifically, a CATV system close to a TV transmitter broadcasting the same channel as that being carried on the cable will produce a second image on the TV screen displaced in position from the image produced by the desired signal.

A number of approaches have been undertaken in an effort to eliminate the direct pickup problem. Some receivers have resorted to the use of back-to-back balun (balanced-to-unbalanced) transformers. However, the degree of immunity to direct pickup is directly related to the balance ratio of the back to back baluns and may be inadequate in an environment characterized by strong ambient fields.

Another approach is to use two "capristors" one connected between the coaxial cable center conductor and the receiver input and the other connected between the coaxial shield and receiver ground. However, the degree of immunity to the direct pickup voltage is inversely related to the impedance between the cable shield and the TV receiver ground, that is, to the effective impedance of the capristor at the operating frequency. Because of the capristors lead inductance and equivalent series resistance, this impedance is often greater than the impedance necessary to provide the desired immunity and some amount of direct pickup voltage will be coupled to the input of the receiver.

This invention is directed to a TV isolation system for a hot chassis receiver that provides improved immunity to direct pickup.

DISCLOSURE OF THE INVENTION

The invention is an apparatus for coupling a source of RF signals to a receiver and for maintaining the receiver's immunity to interfering ambient signals. The apparatus includes a transmission line coupled between the receiver and the signal source. One of the transmission line conductors is connected to the return path of the receiver and coupled via a capacitive element to the return path of the signal source. The apparatus also includes a ferrite element surrounding the transmission line.

This configuration maintains low frequency isolation between the return paths of the receiver and signal source and at the same time establishes low impedance at radio frequencies, thereby affording improved immunity to direct pickup of interfering ambient signals for "hot chassis" receivers, that is, for receivers having a return path (or ground) electrically coupled to the AC power line.

BRIEF DESCRIPTION OF THE DRAWING

The sole drawing is a cross-sectional view of the subject antenna isolation apparatus.

BEST MODE FOR CARRYING OUT THE INVENTION

For a better understanding of the present invention, together with other and further objects, advantages and capabilities thereof, reference is made to the following disclosure and appended claims in connection with the above-described drawing.

Referring now to the drawing, the subject antenna isolation apparatus includes a first transmission line in the form of a coaxial cable 1. The cable is comprised of an inner conductor 11, an outer conductor (or sheath) 13, and a dielectric material 12. The signal-carrying inner conductor is coupled at one end through a capacitor, C1, to a source of radio frequency (RF) signals (not shown). The RF signals may be supplied from a coaxial cable terminated in a suitable connector 2 so that the signal path is connected to C1 and the return path (or ground) is connected to the connector. The other end of conductor 11 is coupled to the signal path (input) of the receiver. The outer conductor 13 is connected to the receiver return path (or ground). The apparatus also includes first and second disc-shaped feedthrough capacitors, C2 and C3, each comprising an inner conductor 3, a dielectric material 4 and an outer conductor 5. C2 and C3 each have central apertures having diameters approximately equal to the outer diameter, D1, of the coaxial cable. C2 and C3 are positioned around the coaxial cable so that their inner conductors are in contact with the outer conductor of the cable. As shown in the drawing, C3 is located at the end of the cable nearer to the receiver; C2 is located at the end of the cable near the source of RF signals. In a manner to be described, the outer conductors of C2 and C3 are connected to the return path of the source of RF signals, thereby establishing a relatively low RF impedance between it and the corresponding receiver return path.

As alluded to above, the receiver's immunity to direct pickup of ambient signals is inversely related to the impedance between the receiver return path and the return path of the source of RF signals. Although C2 and C3 serve to reduce this impedance, they cannot reduce it to zero in the frequency range of interest, 54 to 220 MHz for television receivers. As a result a current will flow in the outer conductor of the coaxial cable and a spurious signal component will be added to the desired signal and coupled to the input of the receiver.

It has been found that by surrounding the coaxial cable with a suitable ferrite material the current in the outer conductor can be reduced, with a corresponding reduction in the direct pickup of the ambient signal. A ferrite toroid, 6, such as a Micrometal device designated T106-15, positioned around the coaxial cable between C2 and C3 has been found to afford approximately an order of magnitude improvement in direct pickup immunity. Although the precise reason for this improvement is not known, it is hypothesized that the ferrite material, which is very lossy in the frequency range of interest, tends to suppress the magnetic field around the coaxial cable, thereby reducing the current in its outer conductor.

A preferred embodiment of the subject antenna isolation system also includes a cylindrical enclosure or sleeve 7, fabricated from a conductive material, i.e., a metal such as brass or copper, surrounding the coaxial cable, feedthrough capacitors and ferrite toroid. The inner diameter of the enclosure, D2, is approximately equal to the outer diameter of the feedthrough capacitors so that the enclosure comes in contact with the outer conductor of the capacitors. The enclosure makes contact, i.e., is soldered, at one end to the connector so that the feedthrough capacitors are connected to the return path of the RF signal source through the enclosure. This additionally serves to reduce the impedance between receiver return path and the signal source return path. The coaxail cable can be supported at the other end of the enclosure but it is necessary to maintain electrical isolation between the outer conductor of the coaxial cable and the enclosure.

When the antenna isolation apparatus is constructed in this fashion, it may be viewed as two concentric transmission lines, cable 1 being the inner transmission line. Conductor 13 and enclosure 7 can be construed as a second, outer, transmission line having conductor 13 as its inner conductor and the enclosure as its outer conductor.

The concentric transmission line configuration has been found to increase the receiver's immunity to direct pickup of interfering ambient signals and to that extent is considered a preferred embodiment of this invention. However, it should be noted that even without cylindrical enclosure, the antenna isolation apparatus as described herein affords a substantial improvement in immunity over that available in the known prior art.

Accordingly, while there has been shown and described what are at present considered the preferred embodiments of the invention, it will be obvious to those skilled in the art that various changes and modifications may be made therein without departing from the scope of the invention as defined by the appended claims.

What is claimed is:

1. An apparatus for coupling a source of RF signals to a receiver and for isolating said receiver from ambient interfering signals, said apparatus comprising:
   a transmission line having a first conductive element coupled at a first end to the signal path of the source of RF signals and coupled at a second end to the signal path of the receiver and having a second conductive element coupled to the return path of the receiver;
   a first capacitive element coupling the second conductive element to the return path of the source of RF signals, and
   a ferrite element surrounding the transmission line.

2. An apparatus as defined in claim 1 wherein the first capacitive element is positioned nearer the first end of the transmission line, said apparatus further comprising a second capacitive element positioned nearer the second end of the transmission line and coupling the second conductive element to the return path of the source of RF signals.

3. An apparatus as defined in either claim 1 or claim 2 further comprising a conductive enclosure surrounding the transmission line and the ferrite element and connected to the return path of the source of RF signals.

4. An antenna isolation apparatus comprising:
   a coaxial transmission line having an inner conductor coupled at a first end to the signal path of a source of RF signals and at a second end to the signal path of a receiver and having an outer conductor coupled to the return path of the receiver;
   a first disc capacitor positioned around the transmission line and coupling the outer conductor to the return path of the source of RF signals; and
   a cylindrical ferrite element positioned around the transmission line.

5. An apparatus as defined in claim 4 wherein the first disc capacitor is positioned nearer the first end of the transmission line and further comprising a second disc capacitor positioned nearer the second end of the transmission line and coupling the outer conductor to the return path of the source of RF signals and wherein said cylindrical ferrite element is positioned between said disc capacitors.

6. An apparatus as defined in either claim 4 or claim 5 further comprising a conductive cylindrical enclosure surrounding the transmission line and the ferrite element and connected to the return path of the source of RF signals.

7. An apparatus as defined in claim 6 further comprising a capacitor connected between the inner conductor and the signal path of the source of RF signals.

8. An antenna isolation apparatus for coupling a source of RF signals to an input of a receiver, the apparatus comprising:
   first signal conducting means having first and second conductive elements, said first and second elements respectively coupled to the signal path and to the ground return path of the source of RF signals;
   second signal conducting means having third and fourth conductive elements, said third and fourth elements respectively coupled to the signal path and ground return path of the receiver;
   first capacitive means for coupling the first conductive element to the third conductive element;
   second and third capacitive means for coupling the second conductive element to the fourth conductive element; and
   a ferrite element enclosing said second signal conducting means and interposed between said second and third capacitive means.

9. An apparatus as defined in claim 8 above further comprising a conductive enclosure, said enclosure surrounding the second conducting means and the ferrite element and connected to the return path of the source of RF signals.

10. A TV antenna isolation system for coupling a source of RF signals to the input of a TV receiver, said system comprising:
    a first coaxial transmission line having a center conductor coupled at one end to the source of RF signals and at the other end to the receiver input and having an outer sheath with the diameter D1, said sheath connected to the receiver ground;

a first disclike capacitive element having a central aperture with a diameter approximately equal to D1, and an outer diameter D2, said first disclike capacitive element positioned around the coaxial transmission line nearer the source of RF signals;

a second disclike capacitive element having a central aperture with a diameter approximately equal to D1 and an outer diameter D2, said second disclike capacitive element positioned around the coaxial transmission line nearer the receiver input;

a cylindrical ferrite member having an inner diameter approximately equal to D1, said ferrite member positioned around the coaxial transmission line intermediate the first and second disclike capacitive elements; an outer metal sleeve having a diameter approximately equal to D2, said sleeve positioned around and enclosing the coaxial transmission line, first and second disclike capacitive elements, and ferrite member.

11. A TV antenna isolation system as defined in claim 10 wherein the disclike capacitive elements each have inner conductors in contact with the outer sheath and outer conductors in contact with the metal sleeve so that the capacitors operate to reduce the RF impedance between the outer sheath and metal sleeve.

* * * * *